(12) United States Patent
Ikeda et al.

(10) Patent No.: US 8,129,213 B2
(45) Date of Patent: Mar. 6, 2012

(54) SOLID-STATE IMAGING DEVICE AND METHOD FOR MANUFACTURING THE SAME

(75) Inventors: Harumi Ikeda, Kanagawa (JP); Masashi Nakazawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 212 days.

(21) Appl. No.: 12/545,924

(22) Filed: Aug. 24, 2009

(65) Prior Publication Data

US 2010/0053400 A1 Mar. 4, 2010

(30) Foreign Application Priority Data

Aug. 26, 2008 (JP) ................................. 2008-217255

(51) Int. Cl.
*H01L 21/00* (2006.01)
(52) U.S. Cl. .......... 438/72; 438/69; 250/208.1; 257/436
(58) Field of Classification Search ................ 250/208.1; 257/29, 69, 72, 455; 438/72, 431, 436
See application file for complete search history.

(56) References Cited

U.S. PATENT DOCUMENTS

| | | | | |
|---|---|---|---|---|
| 2008/0036020 A1* | 2/2008 | Ko et al. | ....................... | 257/431 |
| 2009/0050947 A1* | 2/2009 | Dungan et al. | ................ | 257/294 |
| 2009/0194671 A1* | 8/2009 | Nozaki et al. | .............. | 250/208.1 |

FOREIGN PATENT DOCUMENTS

| JP | 61-034971 | 2/1986 |
|---|---|---|
| JP | 63-093174 | 4/1988 |
| JP | 06-177414 | 6/1994 |
| JP | 09-252103 | 9/1997 |
| JP | 2001-308366 | 11/2001 |
| JP | 2007-027604 | 2/2007 |
| JP | 2009-188316 | 8/2009 |
| JP | 55-133132 | 11/2010 |

OTHER PUBLICATIONS

Japanese Patent Office Action corresponding to Japanese Serial No. 2008-217255 dated Jun. 1, 2010.
Japanese Patent Office Action corresponding to Japanese Serial No. 2008-217255 dated Sep. 7, 2010.

* cited by examiner

*Primary Examiner* — Fernando L Toledo
(74) *Attorney, Agent, or Firm* — SNR Denton US LLP

(57) ABSTRACT

Disclosed herein is a solid-state imaging device including: a semiconductor layer; a charge accumulation region configured to be formed inside the semiconductor layer and serve as part of a photodiode; and a reflective surface configured to be disposed inside or under the charge accumulation region and be so formed as to reflect light that has passed through the charge accumulation region and direct the light toward a center part of the charge accumulation region.

3 Claims, 12 Drawing Sheets

SOLID-STATE IMAGING DEVICE AND METHOD FOR MANUFACTURING THE SAME

BACKGROUND OF THE INVENTION

1. Field of the Invention

The present invention relates to a solid-state imaging device and a method for manufacturing the same.

2. Description of the Related Art

For a solid-state imaging device such as a CMOS (complementary metal oxide semiconductor) sensor (CMOS solid-state imaging device), the potential design for defining the charge accumulation region of the photodiode in each pixel is becoming difficult as the miniaturization of the pixels progresses.

The reasons why the potential design becomes difficult are as follows.

Of visible light beams, red light exhibits a low absorption coefficient in silicon. Therefore, photoelectric conversion thereof is performed also in a comparatively deep part of the photodiode.

Therefore, potential needs to be formed in a deep part of silicon in order to enhance the sensitivity to the red light.

Forming the deep potential requires ion implantation with high energy.

For the ion implantation with high energy, the resist used as the mask of the ion implantation needs to have large thickness.

However, because the resist formed as the mask of etching needs to have large thickness, the resist as the mask has a higher aspect ratio along with the miniaturization.

Therefore, it is becoming difficult to form the resist mask with high accuracy.

In addition, when the aspect ratio of the resist as the mask is higher, a lower part of the resist is thinner and thus the resist tends to fall down more easily, which causes the lowering of the manufacturing yield.

Furthermore, the profile of ion implantation with higher energy has wider lateral broadening.

Therefore, as the miniaturization of the pixels progresses, the isolation becomes more difficult and implanted impurity ions spread to adjacent pixels more frequently.

Because the ion implantation with high energy is difficult, red light, which reaches a deep part of silicon, exhibits a low rate of photoelectric conversion in the charge accumulation region, which causes sensitivity deterioration and color mixing.

To address this problem, there has been proposed a structure in which a reflective film is provided under the photodiode in each pixel so that light that has reached an area deeper than the photodiode may be reflected and returned to the photodiode (refer to e.g. Japanese Patent Laid-Open No. 2007-27604 (hereinafter, Patent Document 1)).

This structure eliminates the need to form the photodiode having large depth and thus also eliminates the need for the ion implantation with high energy.

SUMMARY OF THE INVENTION

By the way, the light incident on the photodiode is not always a light component perpendicular to the incidence plane. If light incident on the photodiode obliquely to the direction of the normal to the incidence plane (the surface of silicon) reaches a deep part of the silicon, this light will get out of the photodiode region.

In particular, red light, which reaches a deep part, easily gets out of the photodiode region when being incident on the photodiode obliquely to the direction of the normal to the incidence plane. This leads to the lowering of the sensitivity to red light.

Furthermore, in the structure described in Patent Document 1, the reflective film having a flat shape is formed. Therefore, light that is incident on the photodiode obliquely to the direction of the normal to the incidence plane and is reflected by the reflective film travels in such a manner as to get away from the center part of the pixel and thus easily gets out of the photodiode region of the pixel. The light that has gotten out of the photodiode region often enters an adjacent pixel and causes color mixing.

Moreover, a method for forming the reflective film under the photodiode is not disclosed in Patent Document 1, and therefore how the reflective film is formed under the photodiode is unclear.

There is a need for the present invention to provide a solid-state imaging device and a method for manufacturing the same, allowing achievement of sufficiently high sensitivity to red light.

According to an embodiment of the present invention, there is provided a solid-state imaging device including a semiconductor layer, a charge accumulation region that is formed inside this semiconductor layer and serves as part of a photodiode, and a reflective surface that is disposed inside or under this charge accumulation region. The reflective surface is so formed as to reflect light that has passed through the charge accumulation region and direct the light toward a center part of the charge accumulation region.

In the solid-state imaging device according to the embodiment of the present invention, the reflective surface is so formed as to reflect light that has passed through the charge accumulation region and direct the light toward the center part of the charge accumulation region. Due to this feature, the light that has passed through the charge accumulation region (e.g. red light) can be reflected by the reflective surface and directed toward the center part of the charge accumulation region so as to be focused on the center part of the charge accumulation region. Thereby, the sensitivity can be enhanced.

According to another embodiment of the present invention, there is provided a method for manufacturing a solid-state imaging device. The method includes the steps of forming recesses in a silicon layer, forming a reflective film on a surface of this silicon layer, and etching this reflective film to divide the reflective film above the recesses of the silicon layer and expose the silicon layer.

Furthermore, the method includes the steps of epitaxially growing silicon from the exposed surface of the silicon layer to thereby form a silicon epitaxial layer covering the reflective film, and turning the silicon layer upside down and bonding the silicon layer onto a base that is separately prepared.

Moreover, the method includes the step of forming a charge accumulation region that serves as part of a photodiode in the silicon layer above the reflective film.

In the method for manufacturing a solid-state imaging device according to the embodiment of the present invention, the recesses are formed in the silicon layer and the reflective film is formed on the surface of the silicon layer. In addition, the reflective film is etched to divide the reflective film above the recesses of the silicon layer. Therefore, the reflective film is so left as to include the projection between the recesses of the silicon layer. Thus, the left reflective film has an upwardly convex shape.

Furthermore, by turning the silicon layer upside down and bonding the silicon layer onto the base, the shape of the reflective film becomes downwardly convex and the upper surface of the reflective film becomes a concave surface.

Moreover, due to the formation of the charge accumulation region in the silicon layer above the reflective film, the reflective film that has the downwardly convex shape and the concave surface as its upper surface is disposed under the charge accumulation region.

This allows manufacturing of a structure in which light that has passed through the charge accumulation region is reflected by the reflective film and directed toward the center part of the charge accumulation region.

According to another embodiment of the present invention, there is provided another method for manufacturing a solid-state imaging device. The method includes the steps of forming, in a silicon layer, a hole that is substantially perpendicular to a surface of this silicon layer and has a concave surface as a bottom surface, forming a reflective film on the surface of the silicon layer and the surface of the concave surface by an anisotropic film deposition method, and forming a second silicon layer on the silicon layer in such a manner as to fill the hole.

Furthermore, the method includes the steps of removing the reflective film and the second silicon layer except for the reflective film and the second silicon layer in the hole, performing ion implantation of silicon for an upper part of the silicon layer and the second silicon layer in the hole to thereby form an amorphous silicon layer, and crystallizing the amorphous silicon layer.

Moreover, the method includes the step of forming a charge accumulation region that serves as part of a photodiode above the reflective film.

In the method for manufacturing a solid-state imaging device according to the embodiment of the present invention, the hole that is substantially perpendicular to the surface of the silicon layer and has a concave surface as its bottom surface is formed, and the reflective film is formed on the surface of the silicon layer and the surface of the concave surface by an anisotropic film deposition method. Due to this feature, the reflective film is hardly deposited on the sidewall of the hole but deposited on the bottom surface of the hole because the hole is substantially perpendicular to the surface of the silicon layer and the reflective film is formed by the anisotropic film deposition method. Furthermore, because the bottom surface of the hole is the concave surface, the reflective film is formed into a concave surface shape along the bottom surface of the hole.

In addition, because the second silicon layer is formed on the silicon layer in such a manner as to fill the hole, the reflective film is buried between the silicon layer and the second silicon layer in the hole formed in the silicon layer.

Furthermore, the reflective film and the second silicon layer except for those in the hole are removed and the amorphous silicon layer is formed through ion implantation of silicon, followed by crystallization of the amorphous silicon layer. Thereby, a crystalline silicon layer sandwiching the reflective film is formed.

Moreover, the charge accumulation region serving as part of the photodiode is formed above the reflective film. This allows manufacturing of a structure in which light that has passed through the charge accumulation region is reflected by the reflective film and directed toward the center part of the charge accumulation region.

According to another embodiment of the present invention, there is provided another method for manufacturing a solid-state imaging device. The method includes the steps of forming trenches in a silicon layer, forming a reflective film on the silicon layer in such a manner as to fill the trenches, and etching the reflective film to divide the reflective film at part between the trenches.

Furthermore, the method includes the steps of turning the silicon layer upside down and bonding the silicon layer onto a base that is separately prepared, and forming a charge accumulation region that serves as part of a photodiode in the silicon layer above the reflective film.

In the method for manufacturing a solid-state imaging device according to the embodiment of the present invention, the trenches are formed in the silicon layer and the reflective film is formed on the silicon layer in such a manner as to fill the trenches. In addition, this reflective film is etched to divide the reflective film at part between the trenches. Due to these steps, the reflective film is so left as to include the part in the trench. Accordingly, the reflective film has a shape with a sidewall portion as the part in the trench and a flat portion as the part other than the part in the trench. The sidewall portion of the reflective film extends downwardly along the trench.

By turning the silicon layer upside down and bonding the silicon layer onto the base, the sidewall portion of the reflective film extends upwardly.

Moreover, due to the formation of the charge accumulation region in the silicon layer above the reflective film, the reflective film having the flat portion and the sidewall portion is formed under the charge accumulation region. This allows manufacturing of a structure in which light that has passed through the charge accumulation region is reflected by the reflective film and directed toward the center part of the charge accumulation region.

The solid-state imaging device according to the embodiment of the present invention allows light that has passed through the charge accumulation region to be reflected and focused on the charge accumulation region, and thus can achieve enhanced sensitivity.

Furthermore, light obliquely incident on the surface of the semiconductor layer can also be reflected and focused on the charge accumulation region, and therefore the entry of the light into an adjacent pixel and the occurrence of color mixing can be suppressed.

Moreover, light that reaches a deep part of the semiconductor layer, such as red light, can also be focused on the charge accumulation region. This eliminates the need to form the charge accumulation region having large depth in the semiconductor layer and thus eliminates the need to perform ion implantation with high energy.

Due to this feature, even if the miniaturization of the pixels progresses, the aspect ratio of the resist as the ion implantation mask is not increased and the break of the resist mask hardly occurs. That is, processing of the mask becomes easier, which can enhance the manufacturing yield.

Therefore, the embodiment of the present invention can realize a solid-state imaging device that has high sensitivity and achieves images having favorable image quality even if the miniaturization of the pixels progresses. Furthermore, this solid-state imaging device can be stably manufactured.

Each of the methods for manufacturing a solid-state imaging device according to the embodiments of the present invention allows manufacturing of a structure in which light that has passed through the charge accumulation region is reflected by the reflective film and directed toward the center part of the charge accumulation region.

Furthermore, by any method, the manufacturing can be carried out by using steps that are normally carried out in semiconductor manufacturing. Therefore, a solid-state imaging device in which the reflective film is provided for the charge accumulation region can be manufactured easily and stably.

DETAILED DESCRIPTION OF THE PREFERRED EMBODIMENTS

Figure 1A:
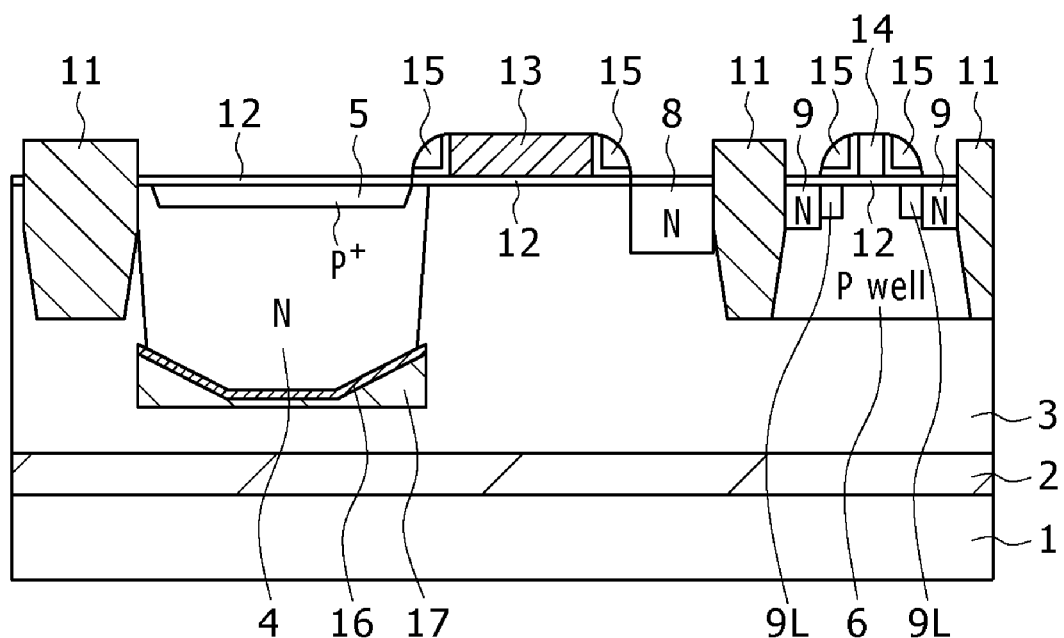
FIGS. 1A and 1B are schematic structural diagrams (sectional views) of a solid-state imaging device according to a first embodiment of the present invention.

The contents of the present invention and specific embodiments of the present invention will be described below in the order of the following items.
1. Outline of Present Invention
2. Structure and Manufacturing Method of First Embodiment of Present Invention
3. Structure and Manufacturing Method of Second Embodiment of Present Invention
4. Modification Examples and Other Structures of Present Invention

1. Outline of Present Invention

In solid-state imaging devices according to embodiments of the present invention, a reflective surface is provided inside or under a charge accumulation region of a photodiode serving as a light-receiving part (on the opposite side to the light incidence side). Due to this feature, light that has reached a deep part and has passed through the charge accumulation region (particularly red light) can be reflected and returned to the charge accumulation region. Thus, the sensitivity can be enhanced.

Furthermore, in the solid-state imaging devices according to the embodiments of the present invention, the reflective surface is so formed that the light that has passed through the charge accumulation region is reflected and directed toward the center part of the charge accumulation region.

The term "the center part of the charge accumulation region" mainly refers to the center part in the planar direction of the charge accumulation region, but refers also to the center part in the depth direction of the charge accumulation region.

Several shapes will be available as the shape of the reflective surface that satisfies this condition.

The reflective surfaces that satisfy the condition are roughly categorized into the following two kinds: (1) reflective surface having a shape whose surface on the charge accumulation region side is a concave surface totally, and (2) reflective surface having a major portion and a side portion for reflecting light that is obliquely incident on the semiconductor layer and directed toward the outside of the charge accumulation region so that this light may be directed toward the center part of the charge accumulation region.

The reflective surface can be formed of a comparatively thin reflective film itself or the surface of a layer having somewhat large thickness.

Reflective surfaces formed of a reflective film itself will be mainly described below.

In the case of forming a reflective surface of the above-described kind (1) by a reflective film itself, the reflective film is formed into a shape whose surface on the charge accumulation region side is a concave surface totally.

Examples of such a shape include a shape in which the slope of the plane increases in a stepwise manner from the center part to the outside (the section has a polygonal shape) and a curved surface shape that is downwardly convex.

In the case of employing a curved surface shape, the shape is so designed that the normal to the curved surface is perpendicular to the light incidence plane or passes through the center part of the charge accumulation region. For example, a parabolic surface or an elliptic surface is employed.

In the case of forming a reflective surface of the above-described kind (2) by a reflective film itself, the reflective film is formed into a shape having a major portion and a sidewall portion for reflecting light directed toward the outside.

It is desirable to form the sidewall portion along the direction perpendicular to the surface of the semiconductor layer in which the photodiode is formed (light incidence plane). However, it may be inclined to a certain extent (by an angle equal to or smaller than 45 degrees).

Operations and effects of the embodiments of the present invention will be described below based on comparison between the structures of the solid-state imaging devices of the embodiments of the present invention and the structure described in Patent Document 1.

Figure 21:
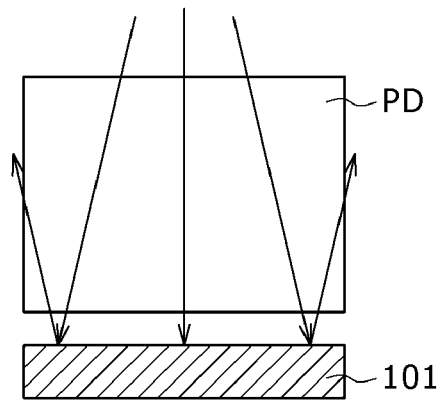
FIG. 21 is a diagram showing reflected light when a reflective film is flat.

FIG. 21 shows a structure in which a flat reflective film is disposed under a charge accumulation region like that described in Patent Document 1.

As shown in FIG. 21, light that is obliquely incident on a photodiode PD is reflected by a flat reflective film 101 and then travels in such a manner as to get away obliquely upward toward the outside of the photodiode PD. This causes loss in light reception detection and lowers the sensitivity.

Figure 22A:
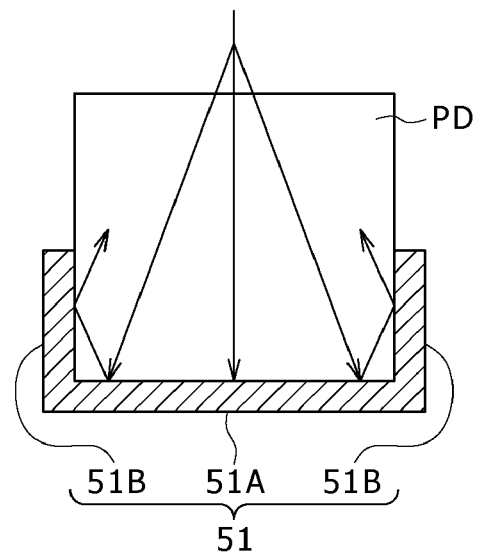
FIG. 22A is a diagram showing reflected light when a reflective film has a sidewall portion.
Figure 22B:
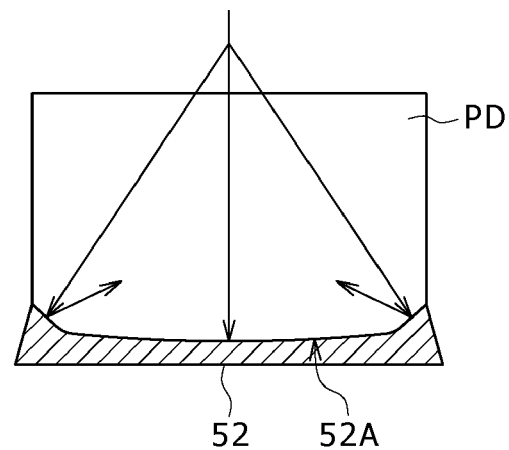
FIG. 22B is a diagram showing reflected light when a reflective film has a concave surface.

FIGS. 22A and 22B show the structures of the solid-state imaging devices of the embodiments of the present invention.

In the structure shown in FIG. 22A, a reflective film 51 has a flat portion 51A under the photodiode PD and a sidewall portion 51B outside (on the side of) the photodiode PD.

The flat portion 51A is formed substantially parallel to the light incidence plane (the surface of the silicon layer). The sidewall portion 51B is formed substantially perpendicular to the light incidence plane (the surface of the silicon layer).

This structure allows light obliquely incident on the photodiode PD to be reflected by the sidewall portion 51B of the reflective film 51 and directed toward the center part of the photodiode PD.

FIG. 22A shows light that is first reflected by the flat portion 51A of the reflective film 51 and then reflected by the sidewall portion 51B. Although not shown in the diagram, light obliquely incident directly on the sidewall portion 51B can also be directed toward the center part of the photodiode PD through reflection by each of the sidewall portion 51B and the flat portion 51A.

In FIG. 22A, the flat portion 51A and the sidewall portion 51B of the reflective film 51 are formed in contact with the outside of the photodiode PD.

However, in the embodiments of the present invention, the flat portion 51A and the sidewall portion 51B of the reflective film 51 may be somewhat distant from the photodiode PD or intrude into the inside of the photodiode PD to a certain extent.

Furthermore, the sidewall portion 51B of the reflective film 51 does not need to be substantially perpendicular to the light incidence plane (the surface of the silicon layer) as shown in FIG. 22A, but may be inclined to the normal to the incidence plane to a certain extent (e.g. inclined to the direction perpendicular to the surface of the silicon surface by an angle equal to or smaller than 45 degrees).

In addition, the part of the reflective film other than the sidewall portion does not need to have a shape substantially parallel to the surface of the silicon layer like the flat portion 51A in FIG. 22A, but may have a shape inclined to the surface of the silicon layer (e.g. a V-character shape) or a curved surface shape (e.g. a U-character shape).

It is also possible to form the same shape as that of the reflective film 51 in FIG. 22A by using a layer having somewhat large thickness. However, the sidewall portion having large thickness takes a lot of space and thus precludes the miniaturization of the pixels. Therefore, it is desirable that at least the sidewall portion is formed of a thin reflective film. Moreover, forming all of the reflective film 51 as a thin film offers an advantage that the flat portion and the sidewall portion can be simultaneously formed.

In the structure shown in FIG. 22B, a reflective film 52 under the photodiode PD has a concave surface 52A on the photodiode side.

This structure allows light obliquely incident on the photodiode PD to be reflected by the concave surface 52A of the reflective film 52 and directed toward the center part of the photodiode PD.

As the shape of the concave surface 52A, various shapes are possible in addition to the shape in which the curvature of the curved surface is made different between the inside and the outside as shown in FIG. 22B. For example, the following shapes will be available: a shape in which the inclination angle of the plane is increased in a stepwise manner toward the outside (the sectional shape is polygonal), and a shape composed of a uniform curved surface such as a paraboloid of revolution or an elliptic surface.

In FIG. 22B, the concave surface 52A of the reflective film 52 is formed in contact with the lower end of the photodiode PD.

However, in the embodiments of the present invention, the concave surface 52A of the reflective film 52 may be somewhat distant from the photodiode PD or intrude into the inside of the photodiode PD to a certain extent.

In this manner, in the solid-state imaging devices of the embodiments of the present invention, light incident along a direction inclined to the normal to the incidence plane can also be subjected to photoelectric conversion by the photodiode through selection of the shape of the reflective film.

Figure 23:
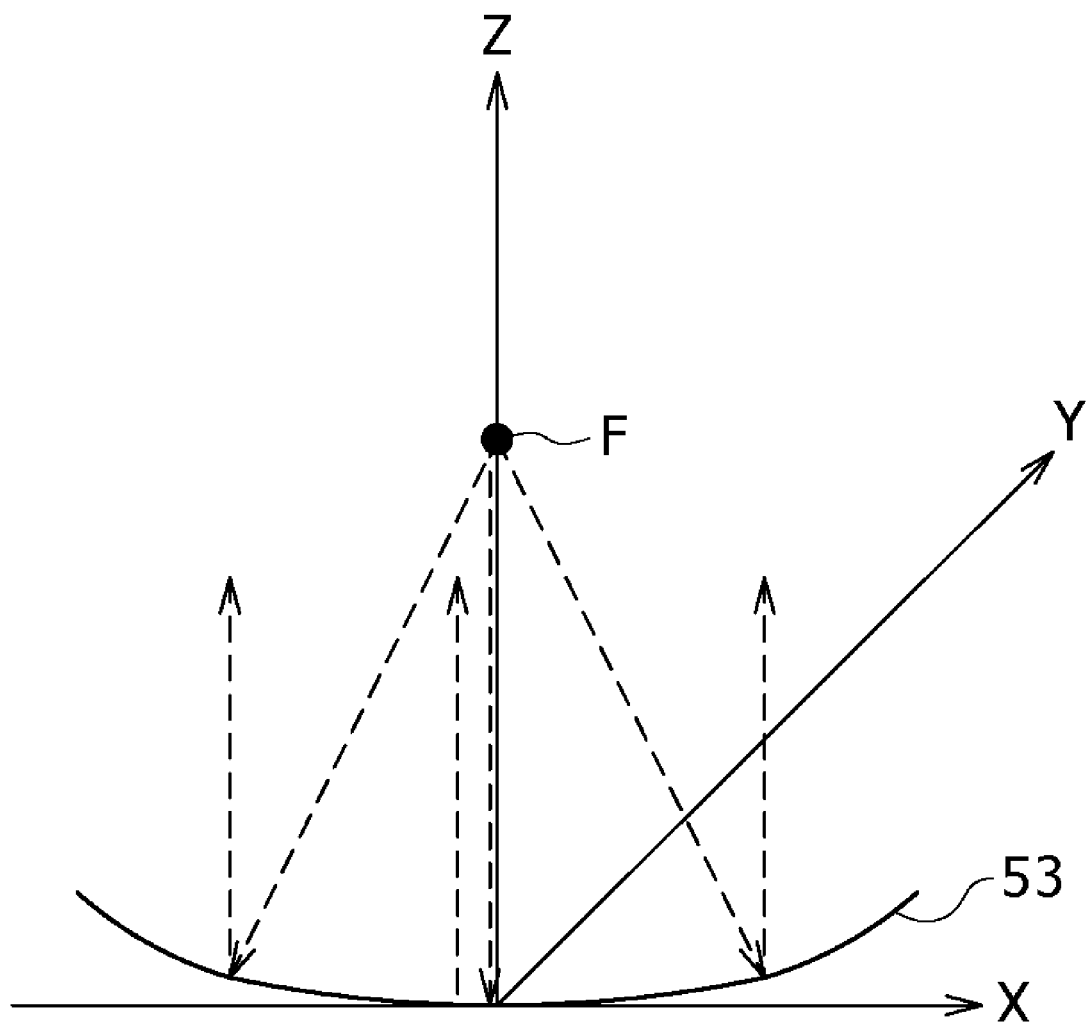
FIG. 23 is a diagram showing the relationship among a concave surface of a reflective film, reflected light, and the focus of the light.

A consideration will be made below on the case in which the light source of incident light is approximated to a focus F as a point light source as shown in FIG. 23.

In this approximation, if the coordinates of the focus F are (0, 0, f) and a reflective surface 53 formed of a reflective film is a paraboloid of revolution defined by the following equation, all of reflected light travels along the direction perpendicular to the incidence plane or toward the center of the charge accumulation region.

$$z=(x^2+y^2)/(4a)(\text{wherein } a \leq f)$$

This is because the equation of a paraboloid of revolution offering the focus F (0, 0, f) is represented as $z=(x^2+y^2)/(4f)$ and therefore the above-described desired state is obtained by setting the curvature of the reflective surface 53 higher than that of this paraboloid of revolution.

Examples of the material of the reflective film include a metal (elemental metal or alloy), an insulator having a refractive index difference with respect to the semiconductor layer (silicon or the like) in which the photodiode is formed, and a multilayer film (so-called dielectric multilayer film) obtained by alternately stacking thin films composed of two kinds of insulators having different refractive indexes (oxide film and nitride film).

However, it is difficult to form a multilayer film into a complex shape with stable film thickness, and therefore the multilayer film is suitable for a uniform curved surface shape and a simple concave surface shape.

With any material, the material is so selected that the reflectance to light having the wavelength as the target of the reflection by the reflective film (e.g. red light) is comparatively high.

Furthermore, if the refractive index of silicon is defined as n1 and the refractive index of the reflective film is defined as n2, the reflectance R to light incident on the reflective surface perpendicularly is represented by an equation $R=\{(n1-n2)/(n1+n2)\}^2$. Therefore, it is preferable that the difference between n2 and n1 be large.

The refractive index n1 of silicon with respect to a wavelength in the red range is about 3.9 (wavelength is 620 nm). If a silicon oxide film is used as the reflective film, n2 is 1.4 (wavelength is 620 nm), and therefore R is 0.22 (22%).

If aluminum is employed as the metal used for the reflective film, n2 is 1.3 (wavelength is 620 nm), and therefore R is 0.25 (25%).

If copper is employed as the metal used for the reflective film, n2 is 0.47 (wavelength is 620 nm), and therefore R is 0.62 (62%).

If gold is employed as the metal used for the reflective film, n2 is 0.13 (wavelength is 620 nm), and therefore R is 0.88 (88%).

If silver is employed as the metal used for the reflective film, n2 is 0.27 (wavelength is 620 nm), and therefore R is 0.76 (76%).

If magnesium is employed as the metal used for the reflective film, n2 is 0.48 (wavelength is 578.0886 nm), and therefore R is 0.61 (61%).

If lithium is employed as the metal used for the reflective film, n2 is 0.22 (wavelength is 635.8974 nm), and therefore R is 0.80 (80%).

Next, specific embodiments of the present invention will be described below.

Figure 1B:
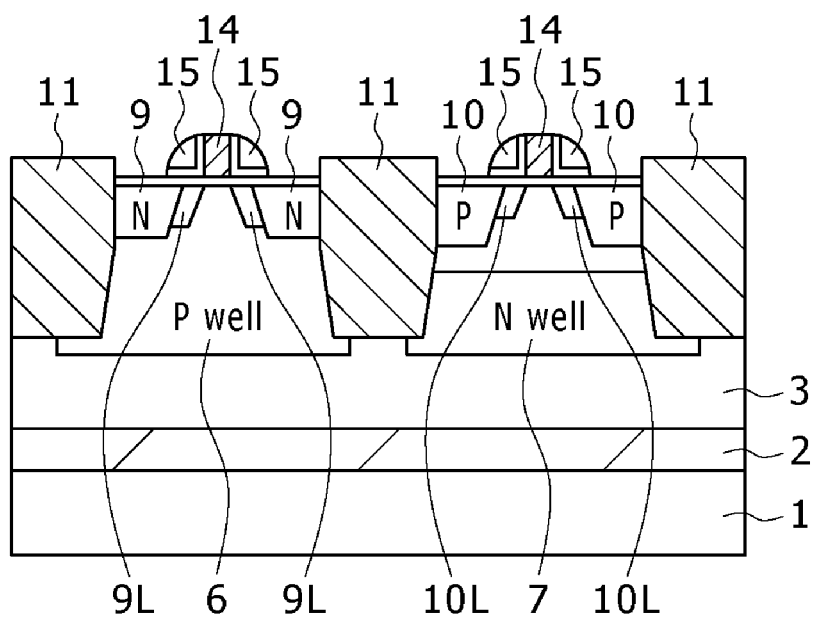

2. Structure and Manufacturing Method of First Embodiment of Present Invention FIGS. 1A and 1B are schematic structural diagrams (sectional views) of a solid-state imaging device according to a first embodiment of the present invention. FIG. 1A is a sectional view of the pixel area, and FIG. 1B is a sectional view of the peripheral circuit part. The present embodiment is application to a CMOS sensor (CMOS solid-state imaging device).

As shown in FIGS. 1A and 1B, a base is formed by stacking a silicon substrate 1, a silicon oxide layer 2, and a silicon layer 3 in that order, and photodiodes, transistors, and so on included in the pixels and the peripheral circuits are formed inside and on the silicon layer 3.

In the pixel area shown in FIG. 1A, an N-type charge accumulation region 4 is formed inside the silicon layer 3 as a region included in a photodiode serving as a light-receiving part. A P-type (P$^+$) hole accumulation region 5 is formed in the vicinity of the surface of the silicon layer 3 above this charge accumulation region 4. The light-receiving part having a so-called hole accumulated diode (HAD) structure is formed by the charge accumulation region 4 and the hole accumulation region 5.

Adjacent to the photodiode, a readout gate electrode composed of a gate electrode 13 and a sidewall insulating layer 15 on the sidewall of the gate electrode 13 is formed.

An N-type drain region is formed on the opposite side to the photodiode across the readout gate electrode. This drain region 8 is equivalent to a so-called floating diffusion for storing charge read out from the photodiode and converting the charge amount to voltage.

An element isolation layer 11 is formed by using an insulating layer (silicon oxide layer or the like) that is so buried in the silicon layer 3 as to surround the photodiode, the readout gate electrode, and the drain region 8.

In the part isolated from the photodiode by the element isolation layer 11, transistors provided in each pixel, such as a reset transistor, an amplification transistor, and a select transistor, are disposed.

These transistors are each formed with a gate electrode 14, the sidewall insulating layer 15 on the sidewall of the gate electrode 14, a gate insulating film 12, and N-type source and drain regions 9, as shown in the right part of FIG. 1A, for example. That is, they are each formed as an N-type MOS transistor (NMOS transistor).

In the peripheral circuit area shown in FIG. 1B, an NMOS transistor having N-type source and drain regions 9 formed in a P-type well region 6 and a PMOS transistor having P-type source and drain regions 10 formed in an N-type well region 7 are formed. These MOS transistors are each formed in an area isolated by the element isolation layer 11. In each MOS transistor, the sidewall insulating layer 15 is formed on the sidewall of the gate electrode 14.

In each of the MOS transistors in FIGS. 1A and 1B, inside the right and left source and drain regions 9 and 10 (on the channel side), regions (so-called LDD regions) 9L and 10L having impurity concentration lower than that of the source and drain regions 9 and 10 are formed.

In the present embodiment, in particular, a reflective film 16 is formed under the charge accumulation region 4 serving as part of the photodiode in the pixel area, and the upper surface of this reflective film 16, i.e. the surface closer to the charge accumulation region 4, is a concave surface.

Because the upper surface of the reflective film 16 is a concave surface in this manner, light obliquely incident can be reflected by the concave surface and directed toward the center part of the charge accumulation region 4 similarly to the case of the reflective film 52 shown in FIG. 22B.

The reflective film 16 is continuously formed under the charge accumulation region 4, and an insulating layer 17 is disposed under the reflective film 16.

As the material of the reflective film 16, a metal having high reflectance to red light (e.g. the above-described metal material such as gold, silver, copper, or magnesium) or a material whose refractive index with respect to red light is greatly different from the refractive index of silicon (silicon oxide or the like) can be used. Furthermore, a dielectric multilayer film that is so designed as to have high reflectance to red light can also be used.

Although not shown in the diagram, a color filter, an inner-layer lens, and an on-chip lens may be formed above the photodiode in the pixel area and an interconnect layer may be formed above the transistors in the pixel area and the peripheral circuit area according to need.

The solid-state imaging device of the present embodiment can be manufactured in the following manner for example.

Figure 2:
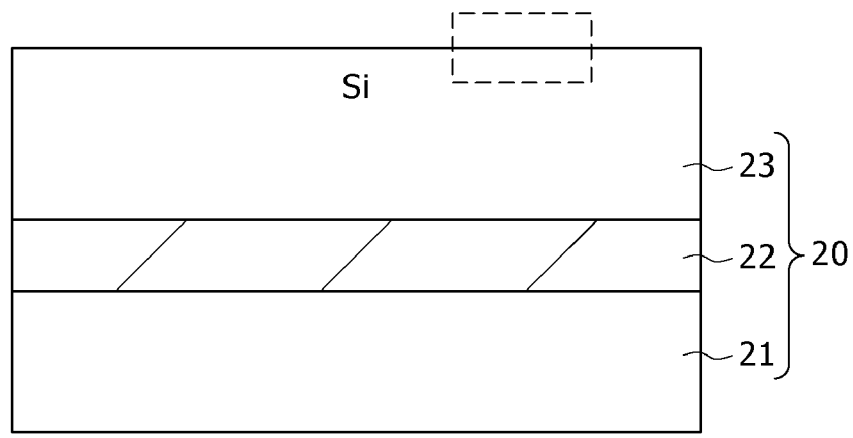
FIG. 2 is a manufacturing step diagram showing a method for manufacturing the solid-state imaging device of FIGS. 1A and 1B.

As shown in FIG. 2, an SOI substrate 20 obtained by stacking a silicon substrate 21, a silicon oxide layer 22, and a silicon layer 23 is prepared. The thickness of the silicon layer 23 is e.g. 2 μm.

Figure 3A:
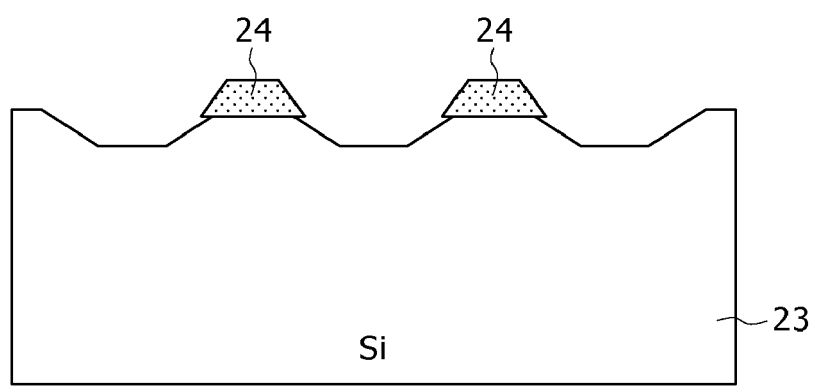
FIGS. 3A and 3B are manufacturing step diagrams showing the method for manufacturing the solid-state imaging device of FIGS. 1A and 1B.
Figure 3B:
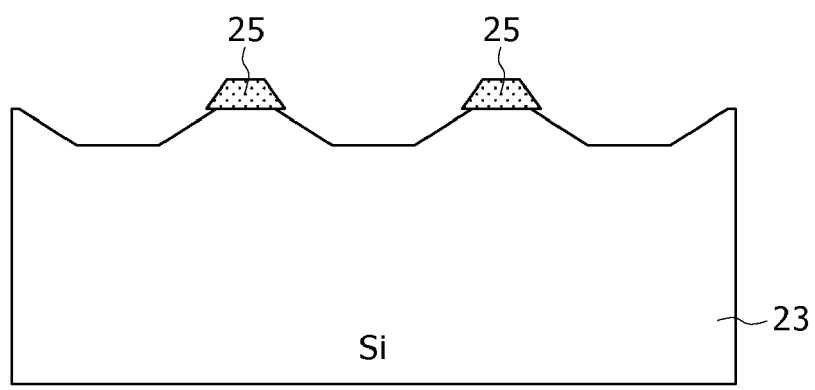

Subsequently, processing for forming projections and recesses is performed for the silicon layer 23 of the SOI substrate 20. FIGS. 3A and 3B are enlarged views of the area surrounded by the dashed line in FIG. 2.

First, as shown in FIG. 3A, a resist 24 is patterned to form a first mask having a tapered hem, and then the silicon layer 23 is processed with use of this first mask. The size of the pattern of the resist 24 as the first mask is e.g. a 1.4-μm square.

After the resist 24 as the first mask is removed, as shown in FIG. 3B, a resist 25 is patterned to form a second mask having a tapered hem, and then the silicon layer 23 is processed with use of this second mask. Through these steps, recesses each having a trapezoidal shape shown in FIG. 3B (or a conical shape or a paraboloid shape, although not shown in the diagram) are formed in the silicon layer 23. For example, the depth of the deepest part of the recess in the silicon layer 23 is about 200 nm.

The resist 25 as the second mask is removed.

Subsequently, the surface of the silicon layer 23 is cleaned.

Figure 4:
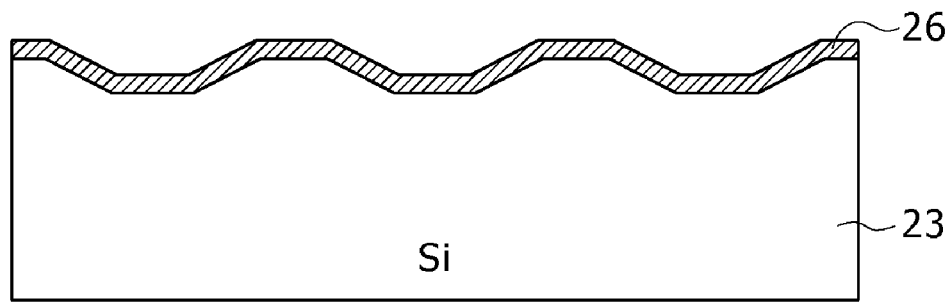
FIG. 4 is a manufacturing step diagram showing the method for manufacturing the solid-state imaging device of FIGS. 1A and 1B.

Thereafter, as shown in the enlarged sectional view of FIG. 4, a reflective film 26 is formed on the surface of the silicon layer 23. The thickness of the reflective film 26 is e.g. 20 nm.

As the reflective film 26, e.g. a metal film, a thermal oxide film, or a dielectric multilayer film can be used.

The reflective film 26 may be obtained as follows. Specifically, a thermal oxide film is formed and then removed by a dilute hydrofluoric acid, followed by rounding of corners of the silicon layer 23. Thereafter, a thermal oxide film is formed again and this thermal oxide film is used as the reflective film 26.

Figure 5:
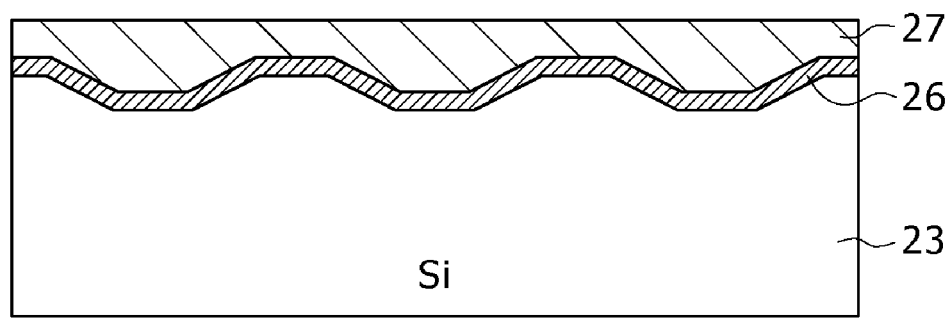
FIG. 5 is a manufacturing step diagram showing the method for manufacturing the solid-state imaging device of FIGS. 1A and 1B.

Subsequent to the formation of the reflective film 26, as shown in the enlarged sectional view of FIG. 5, an insulating layer 27 is formed on the reflective film 26. For example, a tetraethoxysilane (TEOS) layer is formed to a thickness of 300 nm by low-pressure CVD (chemical vapor deposition).

Thereafter, the surface of the insulating layer 27 is planarized by chemical mechanical polishing (CMP) or the like as shown in FIG. 5.

Figure 6:
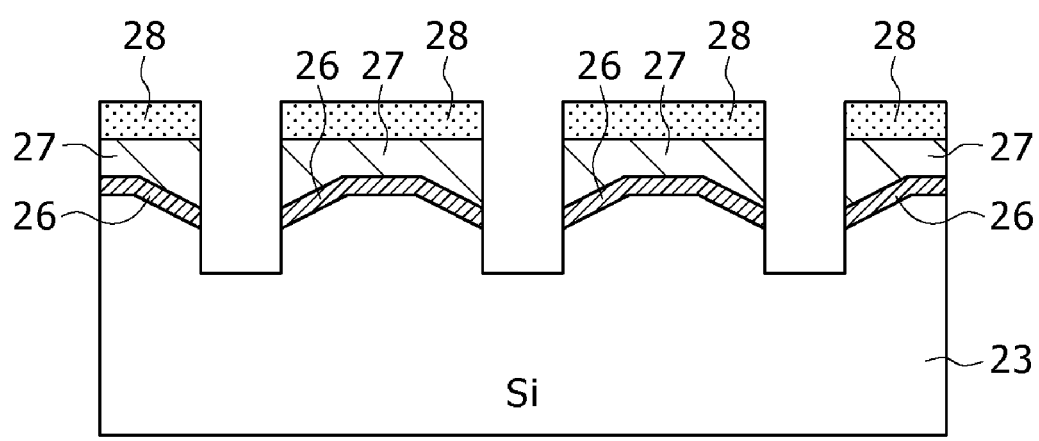
FIG. 6 is a manufacturing step diagram showing the method for manufacturing the solid-state imaging device of FIGS. 1A and 1B.

Subsequently, as shown in the enlarged sectional view of FIG. 6, a resist 28 formed on the planarized insulating layer 27 is so patterned that the partial portions thereof above the projections of the silicon layer 23 are left, to thereby form a mask. With use of this mask, the insulating layer 27 and the reflective film 26 except for those in the regions around which photodiodes are to be formed are removed by etching.

Due to this removal, the silicon layer 23 is exposed and the reflective film 26 is so divided above the recesses of the silicon layer 23 as to be left in the regions around which the photodiodes are to be formed, so that the reflective film 26 is so left as to include the projections between the recesses of the silicon layer 23. The left reflective film 26 has an upwardly convex shape as shown in FIG. 6.

The reflective film 26 is unnecessary in the part of the peripheral circuit area and the transistors in the pixel area, and therefore the reflective film 26 is removed in this step.

Figure 7:
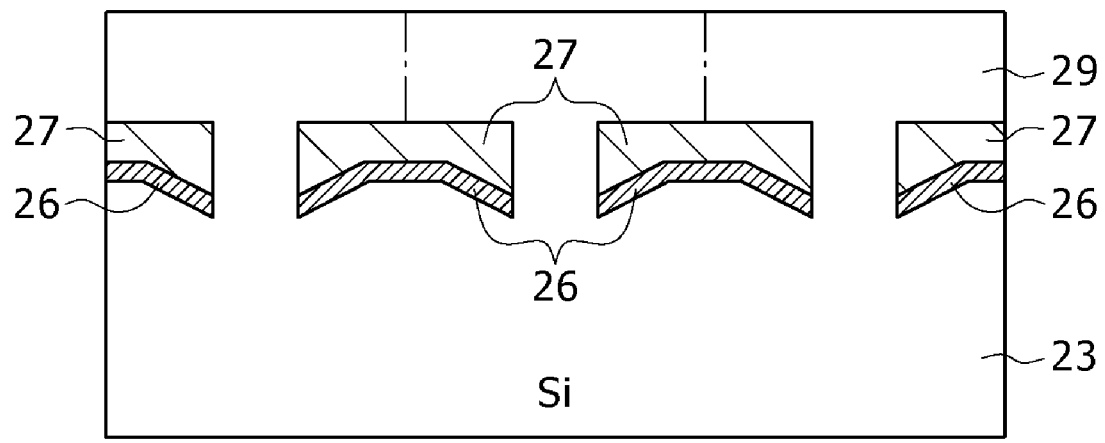
FIG. 7 is a manufacturing step diagram showing the method for manufacturing the solid-state imaging device of FIGS. 1A and 1B.

Subsequently, as shown in the enlarged sectional view of FIG. 7, epitaxial growth of silicon from the exposed surface of the silicon layer 23 is performed by a thickness of e.g. 500 nm. Thereby, a silicon epitaxial layer 29 is so formed as to cover the reflective film 26 and the insulating layer 27.

In this step, faults at the joint part of the grown silicon layer 29 arise as shown by the chain lines above the insulating layer 27. However, the fault part is not used for the charge accumulation region 4 and therefore leads to no particular problem.

Figure 8:
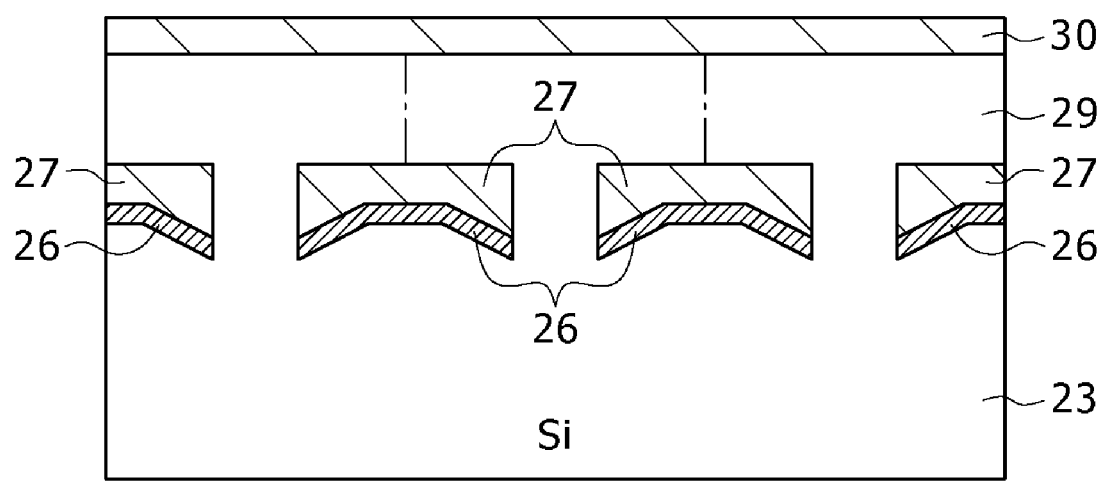
FIG. 8 is a manufacturing step diagram showing the method for manufacturing the solid-state imaging device of FIGS. 1A and 1B.

Subsequently, as shown in the enlarged sectional view of FIG. 8, a thermal oxide film 30 having a thickness of e.g. 100 nm is formed on the surface of the silicon epitaxial layer 29.

The subsequent steps are shown with not sectional views arising from the enlargement of the area in the dashed line in FIG. 2 but sectional views having the same scale as that of FIG. 2.

Figure 9:
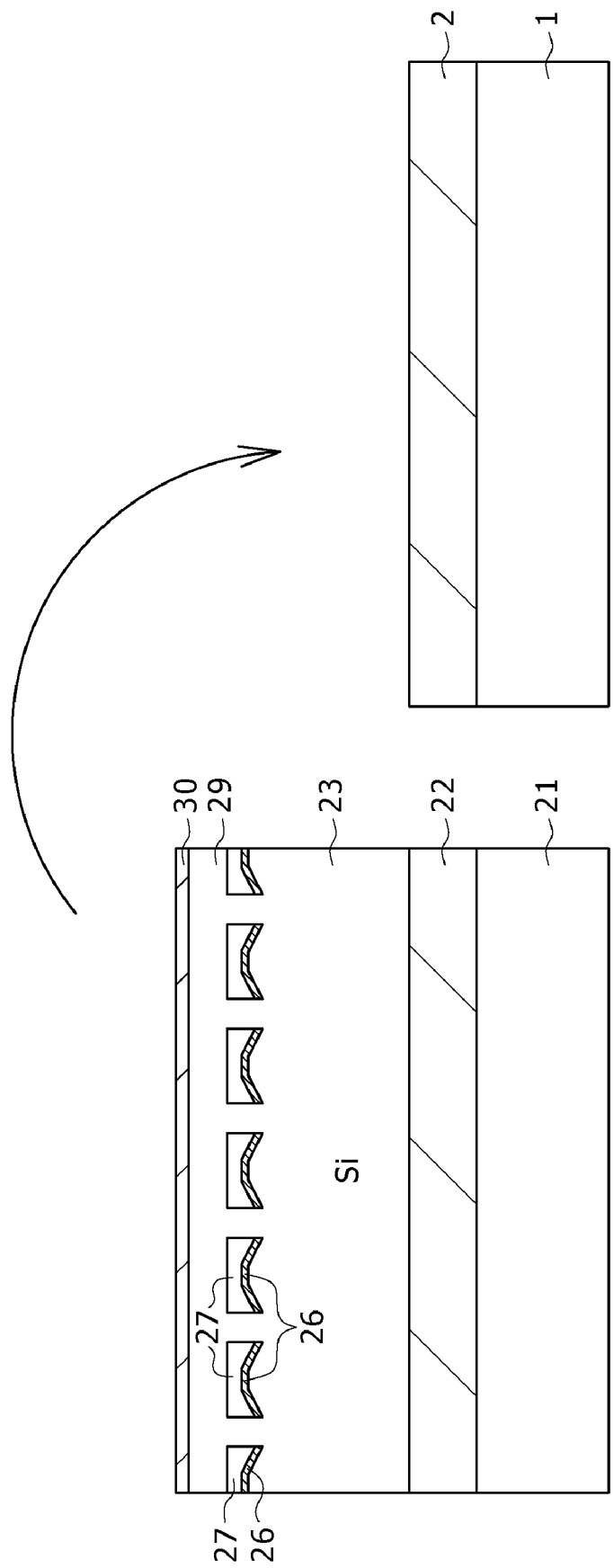
FIG. 9 is a manufacturing step diagram showing the method for manufacturing the solid-state imaging device of FIGS. 1A and 1B.

As shown on the right side of FIG. 9, a base obtained by forming the silicon oxide layer (thermal oxide film or the like) 2 on the silicon substrate 1 is prepared. Furthermore, the multilayer body formed through the process until the step of FIG. 8 is shown on the left side of FIG. 9.

The multilayer body shown on the left side of FIG. 9 is turned upside down, and the thermal oxide film 30 of the multilayer body is bonded to the silicon oxide layer 2 of the base on the right side by plasma bonding or the like.

Figure 10:
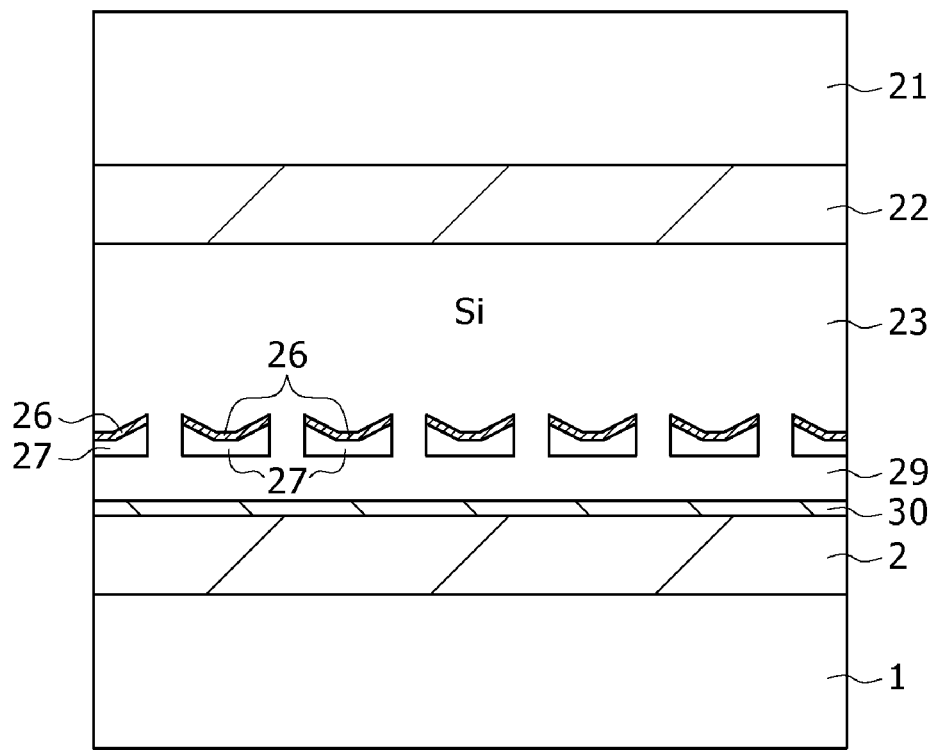
FIG. 10 is a manufacturing step diagram showing the method for manufacturing the solid-state imaging device of FIGS. 1A and 1B.

The state obtained after this bonding is shown in FIG. 10. As shown in FIG. 10, because the multilayer body is turned upside down, the reflective film 26 has a downwardly convex shape and the upper surface of the reflective film 26 is a concave surface.

Although the bonding method is not limited to the plasma bonding, it is preferable to employ a method that can ensure sufficient bonding endurance against a subsequent heat treatment step.

Figure 11:
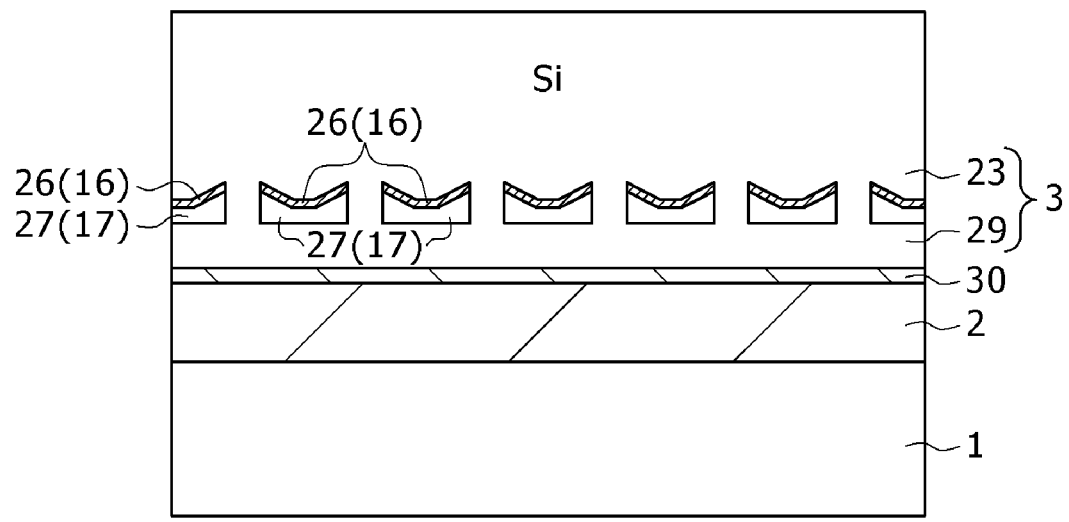
FIG. 11 is a manufacturing step diagram showing the method for manufacturing the solid-state imaging device of FIGS. 1A and 1B.

Subsequently, the silicon substrate 21 and the silicon oxide layer 22 of the SOI substrate 20 are removed to expose the silicon layer 23 as shown in FIG. 11. For example, the silicon substrate 21 is polished by a grinder and chemical mechanical polishing, and then the silicon oxide layer 22 is removed by dilute hydrofluoric acid treatment.

The silicon layer 23 and the silicon epitaxial layer 29 serve as the silicon layer 3 shown in FIGS. 1A and 1B. The reflective film 26 serves as the reflective film 16 in FIG. 1A, and the insulating layer 27 serves as the insulating layer 17 in FIG. 1A.

Subsequently, although not shown in the drawing, recesses for the element isolation layer 11 are formed in the silicon layer 23, and e.g. a silicon oxide layer is so formed as to fill the recesses to thereby obtain the element isolation layer 11.

Thereafter, the charge accumulation regions 4 and the hole accumulation regions 5 are formed by ion implantation in the regions above the reflective films 26 (16) in the silicon layer 23, to thereby form photodiodes having a HAD structure.

Furthermore, in the area in which transistors are to be formed, the P-type well region 6 and the N-type well region 7 are formed by ion implantation.

Subsequently, the respective components of circuit elements such as transistors are formed inside and on the silicon layer 23 (3). The gate electrodes 13 and 14 are formed over the silicon layer 23 (3) with the intermediary of the gate insulating film 12 in FIG. 1A, and the LDD regions 9L and 10L are formed inside the silicon layer 23 (3).

Moreover, the sidewall insulating layer 15 is formed on the sidewalls of the gate electrodes 13 and 14, and the source and drain regions 9 and 10 of MOS transistors are formed inside the silicon layer 23 (3).

Through these steps, the structure shown in FIGS. 1A and 1B can be formed.

Thereafter, steps for forming an inner-layer lens, a color filter, an on-chip lens, an interconnect layer, and so on are carried out according to need.

In this manner, the solid-state imaging device of the present embodiment can be formed.

In the above-described manufacturing method, the charge accumulation region 4 and the hole accumulation region 5 of the photodiode are formed by using the silicon layer 23 in which the reflective film 26 (16) is formed. This makes it possible to suppress the energy of the ion implantation for forming the potentials of the charge accumulation region 4 and the hole accumulation region 5 to 1.5 MeV or lower.

In the steps of FIGS. 3A and 3B, the resist 24 as the first mask and the resist 25 as the second mask are prepared separately from each other. However, also when they are the same resist and used as the same mask, recesses can be formed in the silicon layer 23.

Forming masks separately from each other as shown in FIGS. 3A and 3B can offer a wider range of the shape of the recess that can be formed.

In the above-described manufacturing method, the base is newly prepared and the bonding is performed. However, manufacturing without the bonding is also possible. Such a manufacturing method will be described below with reference to FIGS. 12A to 12E.

A single crystal silicon layer (e.g. a silicon substrate, a silicon epitaxial layer on a silicon substrate, or a single crystal silicon layer of an SOI substrate) is prepared.

First, a hole having a shape that is substantially perpendicular to the surface of the silicon layer and has a concave surface as the bottom surface is formed in the silicon layer through processing with use of a resist pattern as the mask although not shown in the diagram.

Figure 12A:
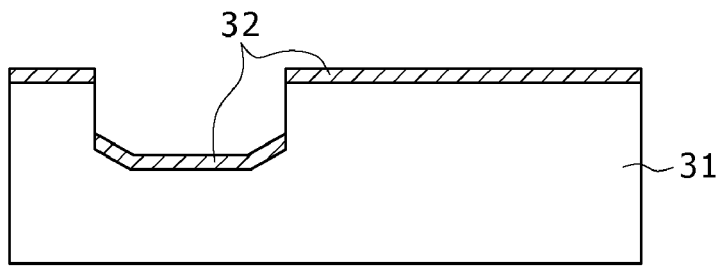
FIGS. 12A to 12E are manufacturing step diagrams showing another method for manufacturing the solid-state imaging device of FIGS. 1A and 1B.

Thereafter, as shown in FIG. 12A, a reflective film 32 is formed on a silicon layer 31 in which this hole is formed, by an anisotropic film deposition method such as sputtering. Due to this step, the reflective film 32 is formed on the surface of the flat part of the silicon layer 31 and the surface of the hole. Because the reflective film 32 is deposited by an anisotropic film deposition method, it is hardly deposited on the sidewall of the hole, substantially perpendicular to the surface of the silicon layer.

A metal film or the like can be used as the reflective film 32.

It is difficult for this film deposition method to uniformly form a multilayer film. Therefore, this method is not suitable for a dielectric multilayer film. In the case of forming a dielectric multilayer film as the reflective film, it is preferable to employ the above-described manufacturing method shown in FIGS. 2 to 11.

Figure 12B:
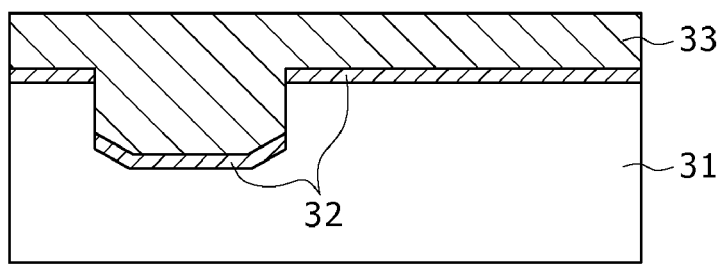

Subsequently, as shown in FIG. 12B, a silicon layer (that is not a single crystal silicon layer but an amorphous silicon layer or a polycrystalline silicon layer) 33 is so formed over the entire surface as to fill the hole of the silicon layer 31. For example, an amorphous silicon layer is formed by CVD. As a result, inside the hole, the reflective film 32 is buried between the silicon layer 31 and the silicon layer 33.

Figure 12C:
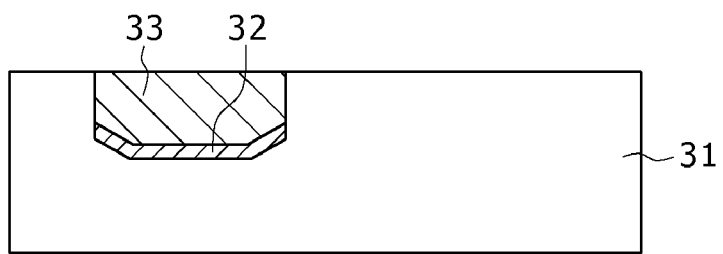

Subsequently, the reflective film 32 and the silicon layer 33 on the flat surface of the silicon layer 31 are removed by CMP or etchback. Due to this removal, the reflective film 32 and the silicon layer 33 are left only in the hole of the silicon layer 31 as shown in FIG. 12C.

Subsequently, ion implantation 34 of silicon is performed for the area around the hole, in which the silicon layer 33 is buried. For example, the energy is set to 2.5 MeV and the dosage is set to $1 \times 10^{15}/cm^2$.

Figure 12D:
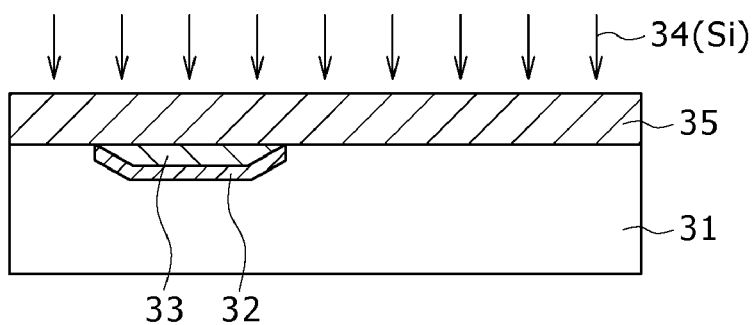

As a result, as shown in FIG. 12D, the silicon layer 31 and the silicon layer 33 for which the ion implantation 34 is performed are turned to an amorphous silicon layer 35.

Thereafter, recrystallization is performed by laser annealing. Thereby, the amorphous silicon layer 35 is crystallized and the silicon layer 33 left in FIG. 12D is also crystallized.

Figure 12E:
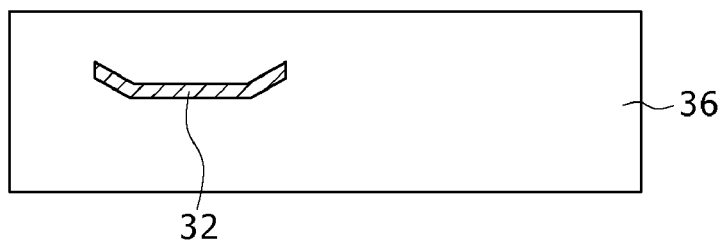

In this manner, as shown in FIG. 12E, a crystalline silicon layer is so formed as to sandwich the reflective film 32 as a silicon layer 36 crystallized except for the part of the reflective film 32. The silicon layer 36 in FIG. 12E is used as the silicon layer 3 in FIGS. 1A and 1B, and the reflective film 32 is used as the reflective film 16 in FIG. 1A. In this manufacturing method, the insulating layer 17 in FIG. 1A is not formed but the silicon layer 3 is formed in contact with the lower surface of the reflective film 16.

Subsequently, although not shown in the drawing, recesses for the element isolation layer 11 are formed in the silicon layer 3, and e.g. a silicon oxide layer is so formed as to fill the recesses to thereby obtain the element isolation layer 11.

Thereafter, the charge accumulation region 4 and the hole accumulation region 5 are formed by ion implantation in the region above the reflective film 32 (16) in the silicon layer 36 (3), to thereby form a photodiode having a HAD structure.

Furthermore, in the area in which transistors are to be formed, the P-type well region 6 and the N-type well region 7 are formed by ion implantation.

Subsequently, the respective components of circuit elements such as transistors are formed inside and on the silicon layer 36 (3). Thereby, the structure shown in FIGS. 1A and 1B can be formed.

Thereafter, steps for forming an inner-layer lens, a color filter, an on-chip lens, and so on are carried out according to need.

In this manner, the solid-state imaging device of the present embodiment can be formed.

In the above-described manufacturing method, the charge accumulation region 4 and the hole accumulation region 5 of the photodiode are formed by using the silicon layer 36 (3) in which the reflective film 32 (16) is formed. This makes it possible to suppress the energy of the ion implantation for forming the potentials of the charge accumulation region 4 and the hole accumulation region 5 to 1.5 MeV or lower.

By any manufacturing method, the reflective film can be easily formed under the charge accumulation region 4 in the pixel area.

In the structure of the solid-state imaging device of the above-described present embodiment, the reflective film 16 is provided under the charge accumulation region 4 and the surface of the reflective film 16 closer to the charge accumulation region 4 (upper surface) is a concave surface. Therefore, light obliquely incident can be reflected by the concave surface and directed toward the center part of the charge accumulation region 4 similarly to the case of the reflective film 52 shown in FIG. 22B.

Due to this feature, light that has passed through the charge accumulation region (e.g. red light) can be focused on the center part of the charge accumulation region 4 by the reflective film 16, and thus the sensitivity can be enhanced.

Furthermore, light obliquely incident on the surface of the silicon layer 3 can also be reflected and focused on the charge accumulation region 4, and therefore the entry of the light into an adjacent pixel and the occurrence of color mixing can be suppressed.

In addition, the charge accumulation region 4 having large depth does not need to be formed in the silicon layer 3, and ion implantation with high energy does not need to be performed.

Accordingly, even if the miniaturization of the pixels progresses, the aspect ratio of the resist as the ion implantation mask is not increased and the break of the resist mask hardly occurs. This makes processing of the mask easier and can enhance the manufacturing yield.

Moreover, special apparatus for ion implantation with high energy does not need to be used and the number of steps can also be reduced.

Therefore, even if the miniaturization of the pixels progresses, a solid-state imaging device that has high sensitivity and achieves images having favorable image quality can be realized. Furthermore, this solid-state imaging device can be stably manufactured.

When a metal film is employed as the reflective film 16, the following phenomena often problematically occur in a heat treatment step in the manufacturing: the metal enters the part that is to be turned to the charge accumulation region 4 in the silicon layer 3 due to diffusion; and silicidation occurs due to reaction between the silicon layer 3 and the metal.

In the case of using such a metal, an insulating film serving as a barrier against diffusion and silicidation may be formed between the reflective film 16 and the silicon layer 3 although not shown in the diagram.

In the case of forming the insulating film serving as the barrier, for example, in the manufacturing method shown in FIGS. 2 to 11, before the step of forming the reflective film 26 in FIG. 4, the insulating film serving as the barrier is formed on the surface of the silicon layer 23 and the reflective film 26 is formed on the insulating film. It is also possible to form the insulating film serving as the barrier through thermal oxidation of the surface of the silicon layer 23.

Figure 13:
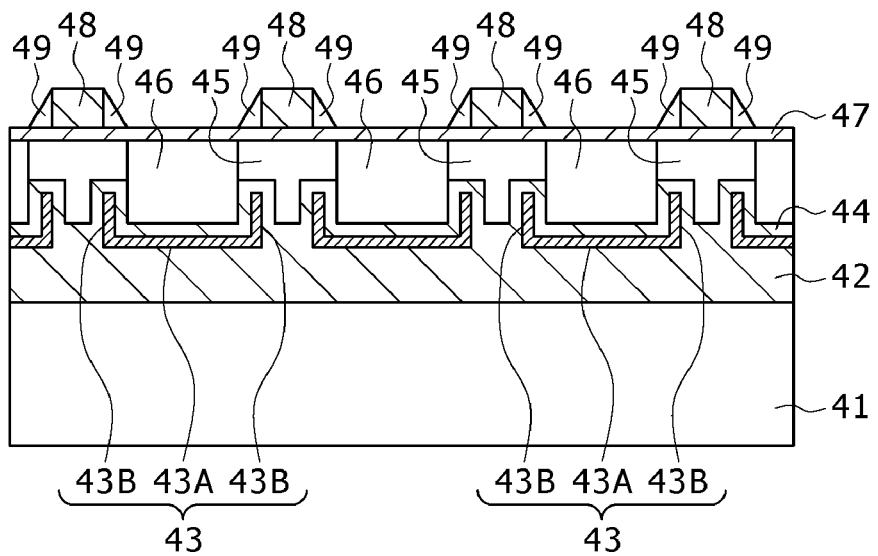
FIG. 13 is a schematic structural diagram (sectional view) of a solid-state imaging device according to a second embodiment of the present invention.

3. Structure and Manufacturing Method of Second Embodiment of Present Invention FIG. 13 is a schematic structural diagram (sectional view) of a solid-state imaging device according to a second embodiment of the present invention. The present embodiment is also application to a CMOS sensor (CMOS solid-state imaging device).

As shown in FIG. 13, a base is formed by stacking a silicon substrate 41, an insulating layer 42, and a silicon layer 45 in that order.

Photodiodes 46 are formed as light-receiving parts inside the silicon layer 45.

Adjacent to the photodiode 46, a readout gate electrode composed of a gate electrode 48 and a sidewall insulating layer 49 on the sidewall of the gate electrode 48 is formed.

A thin gate insulating film 47 is formed between the silicon layer 45 and the readout gate electrodes.

In the photodiode 46 as the light-receiving part, the charge accumulation region 4 and the hole accumulation region 5 shown in FIG. 1A are formed although not shown in the diagram.

Furthermore, in the other part that is not shown in the diagram, various kinds of MOS transistors and drain regions for readout like those shown in FIGS. 1A and 1B are formed.

The present embodiment has a structure in which a reflective film 43 has a flat portion 43A under the photodiode 46 and a sidewall portion 43B outside the photodiode 46 similarly to the reflective film 51 (51A, 51B) described with FIG. 22A.

Because the reflective film 43 has the sidewall portion 43B outside the photodiode 46 in this manner, light obliquely incident can be reflected by the sidewall portion 43B and directed toward the center part of the photodiode similarly to the case of the reflective film 51 shown in FIG. 22A.

As the material of the reflective film 43, a metal having high reflectance to red light (e.g. the above-described metal material such as gold, silver, copper, or magnesium) or a material whose refractive index with respect to red light is greatly different from the refractive index of silicon (silicon oxide or the like) can be used.

An insulating film 44 is formed between the photodiode 46 and the reflective film 43. This insulating film 44 serves as a barrier against diffusion and silicidation in the manufacturing.

Although not shown in the diagram, a color filter, an inner-layer lens, and an on-chip lens may be formed above the photodiode 46 in the pixel area and an interconnect layer may be formed above the transistors in the pixel area and the peripheral circuit area according to need.

The solid-state imaging device of the present embodiment can be manufactured in the following manner for example.

Figure 14:
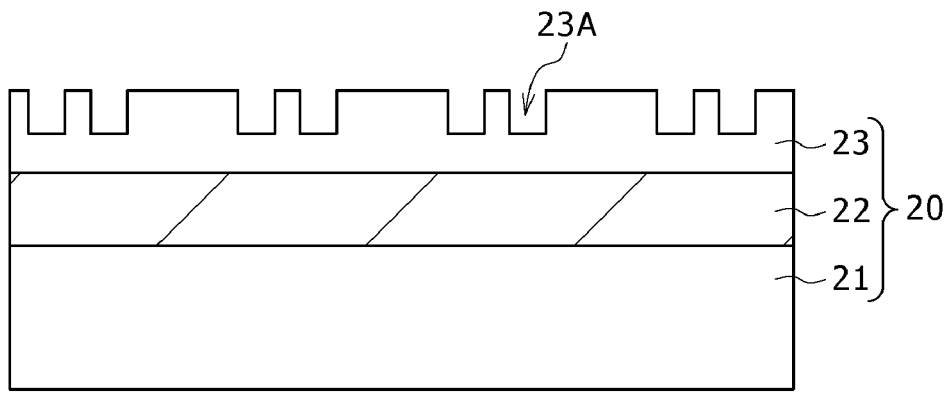
FIG. 14 is a manufacturing step diagram showing a method for manufacturing the solid-state imaging device of FIG. 13.

As shown in FIG. 14, the same SOI substrate 20 as that in FIG. 2 is prepared, and the silicon layer 23 of the SOI substrate 20 is processed to form trenches 23A at the end parts of the regions that are to be turned to the photodiodes 46 later.

Figure 15:
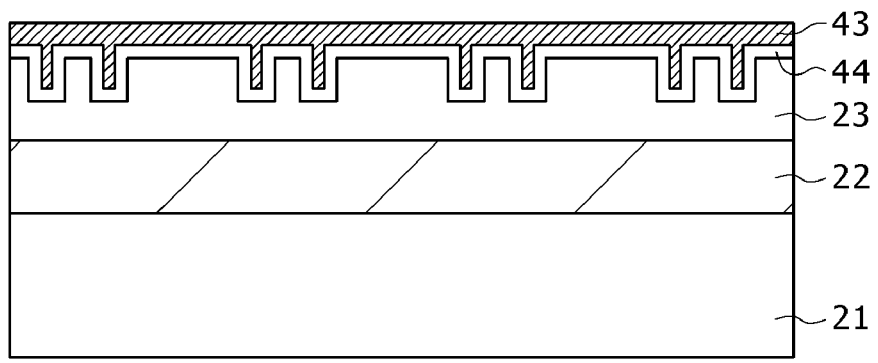
FIG. 15 is a manufacturing step diagram showing the method for manufacturing the solid-state imaging device of FIG. 13.

Referring next to FIG. 15, first, the insulating film 44 serving as the barrier is so formed on the surface of the silicon layer 23 as to have thickness sufficiently smaller than the size of the trenches 23A. For example, a silicon nitride film is formed to a thickness of 50 nm by CVD.

Furthermore, the reflective film 43 is so formed over the entire surface as to fill the inside of the trenches 23A. A metal film can be used as the reflective film 43.

As a result of this step, the reflective film 43 has a portion that exists on the surface and is substantially parallel to the surface of the silicon layer 23 and a portion that exists inside the trench 23A and is substantially perpendicular to the surface of the silicon layer 23.

If the reflective film 43 is formed by using an oxide film or a nitride film, the step is changed as described later.

Figure 16:
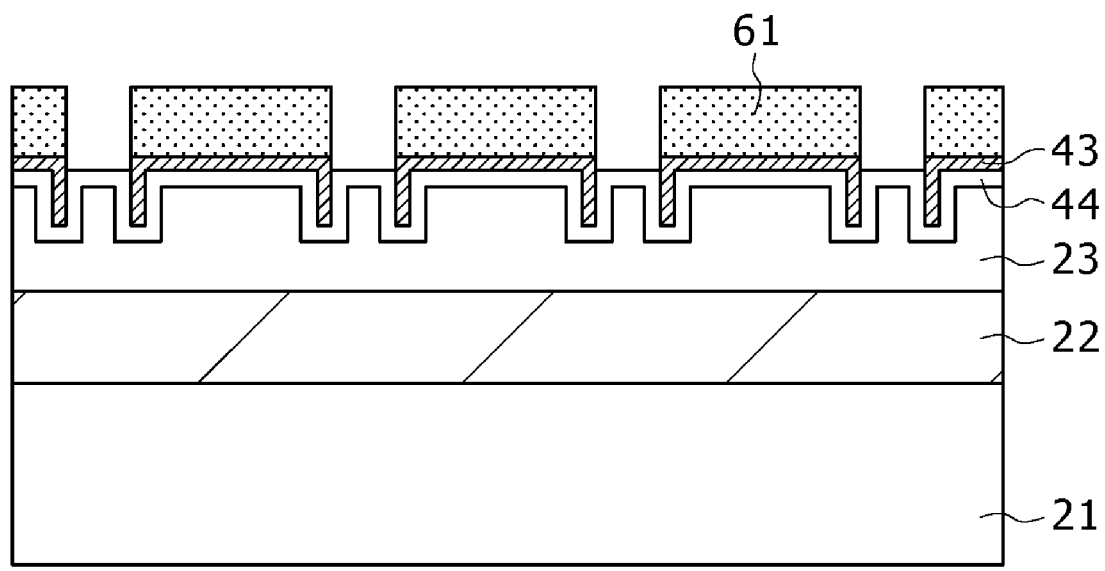
FIG. 16 is a manufacturing step diagram showing the method for manufacturing the solid-state imaging device of FIG. 13.

Subsequently, as shown in FIG. 16, a resist 61 is patterned to form a mask and the reflective film 43 except for that around the regions in which the photodiodes are to be formed is removed by etching with use of this mask.

Due to this removal, the reflective film 43 is divided at the part between the trenches 23A so that it may be left around the regions in which the photodiodes are to be formed. In addition, the reflective film 43 has the sidewall portion as the part in the trench and the flat portion as the part other than the part in the trench. The sidewall portion of the reflective film 43 extends downwardly along the trench.

The reflective film 43 is unnecessary in the part of the peripheral circuit area and the transistors in the pixel area, and therefore the reflective film 43 is removed in this step.

Figure 17:
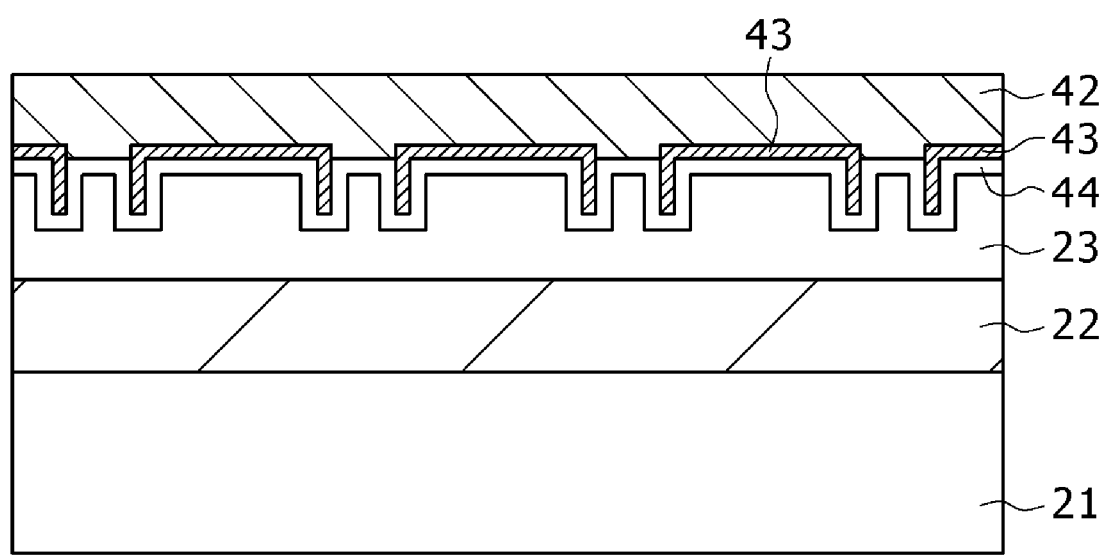
FIG. 17 is a manufacturing step diagram showing the method for manufacturing the solid-state imaging device of FIG. 13.

Subsequently, as shown in FIG. 17, the insulating layer 42 covering the surface is formed. For example, a silicon nitride layer is formed by CVD or the like. This insulating layer 42 is formed to a thickness sufficiently larger than that of the reflective film 43.

Furthermore, in order to suppress the occurrence of voids in a later bonding step, surface planarization treatment such as chemical mechanical polishing may be performed after the formation of the insulating layer 42.

Figure 18:
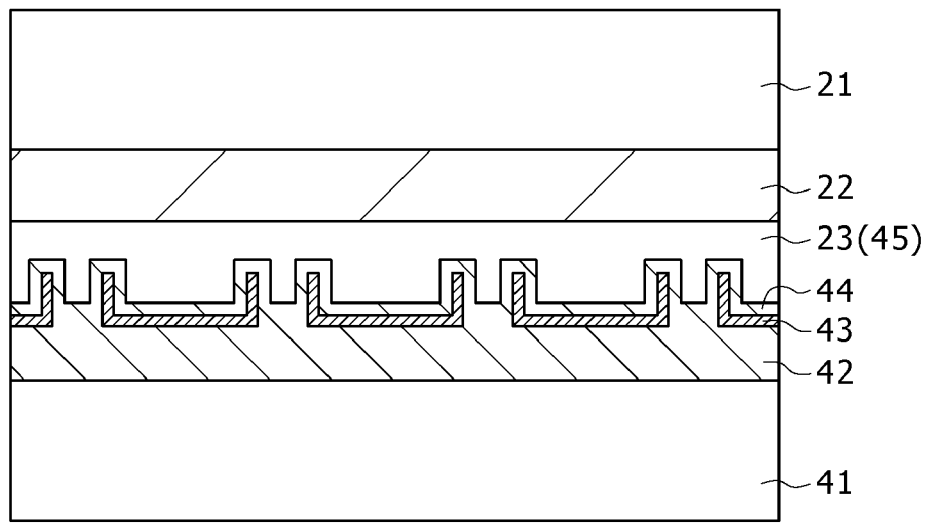
FIG. 18 is a manufacturing step diagram showing the method for manufacturing the solid-state imaging device of FIG. 13.

Subsequently, as shown in FIG. 18, the multilayer body formed through the process until the step of FIG. 17 is turned upside down and bonded onto the silicon substrate 41 by plasma bonding or the like. Although the bonding method is not limited to the plasma bonding, it is preferable to employ a method that can ensure sufficient bonding endurance against a subsequent heat treatment step.

The silicon layer 23 in the multilayer body serves as the silicon layer 45 in FIG. 13. Because the multilayer body is turned upside down, the sidewall portion of the reflective film 43 extends upwardly.

Figure 19:
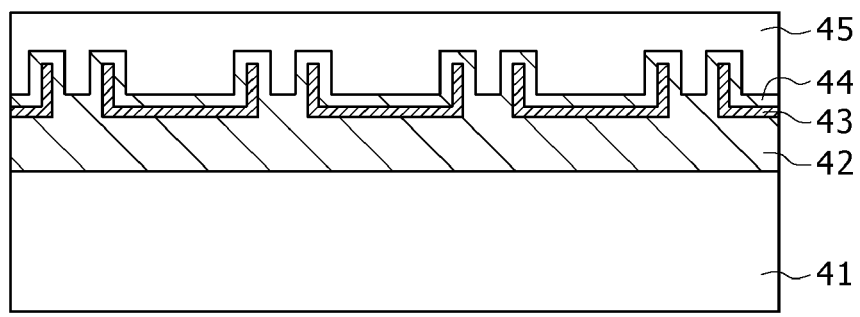
FIG. 19 is a manufacturing step diagram showing the method for manufacturing the solid-state imaging device of FIG. 13.

Subsequently, the silicon substrate 21 and the silicon oxide layer 22 of the SOI substrate 20 are removed to expose the silicon layer 45 as shown in FIG. 19. For example, the silicon substrate 21 is polished by a grinder and chemical mechanical polishing, and then the silicon oxide layer 22 is removed by dilute hydrofluoric acid treatment.

Figure 20:
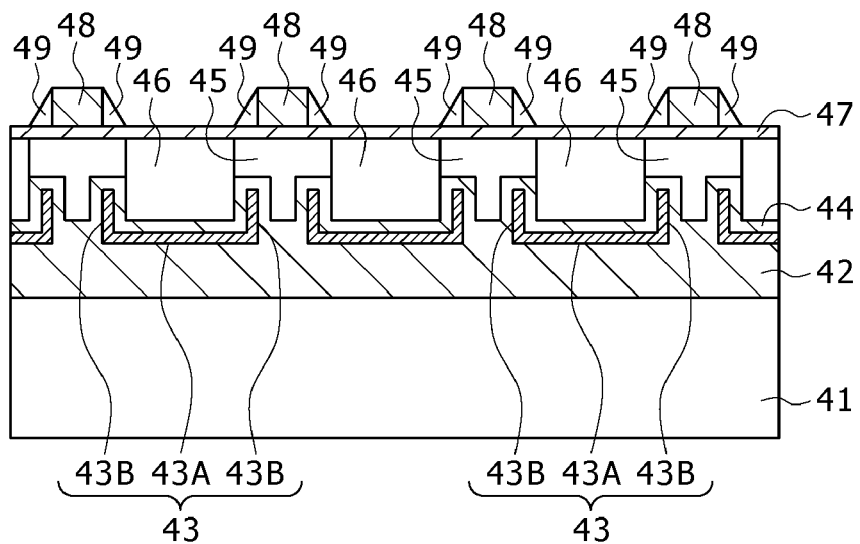
FIG. 20 is a manufacturing step diagram showing the method for manufacturing the solid-state imaging device of FIG. 13.

Subsequently, as shown in FIG. 20, the charge accumulation regions and the hole accumulation regions are formed by ion implantation in the regions above the flat portions 43A of the reflective films 43 in the silicon layer 45, to thereby form the photodiodes 46 each having a HAD structure. Furthermore, the gate electrodes 48 and the sidewall insulating layers 49 are formed over the silicon layer 45 with the intermediary of the gate insulating film 47.

Subsequently, the respective components of circuit elements such as transistors are formed inside and on the silicon layer 45. Thereby, the structure shown in FIG. 13 can be formed.

Thereafter, steps for forming an inner-layer lens, a color filter, an on-chip lens, an interconnect layer, and so on are carried out according to need.

In this manner, the solid-state imaging device of the present embodiment can be formed.

If an oxide film or a nitride film is employed as the reflective film 43, the insulating film 44 serving as the barrier is unnecessary. In this case, in the step of FIG. 15, the reflective film 43 is so formed directly on the silicon layer 23 as to fill the trenches 23A. In this case, the subsequent steps can be carried out similarly to those shown in FIGS. 16 to 20.

In the step shown in FIG. 16, the reflective film 43 is so divided that the left reflective films 43 each have one-to-one correspondence with a respective one of the photodiodes 46 to be formed later, i.e. the reflective film 43 is left for each pixel.

However, the reflective film 43 does not necessarily need to be so divided as to be left for each pixel in this step, but the reflective film 43 may be continuous for several pixels adjacent to each other. The division way may be any as long as the reflective films 43 are left at least around the regions in which the photodiodes are to be formed.

However, an alignment mark needs to be formed in the pixel area in order to align the position of the mask of the ion implantation for the photodiodes. Therefore, the reflective film 43 is removed at least from the part in which the alignment mark is formed.

In the structure of the solid-state imaging device of the above-described present embodiment, the reflective film 43 below the photodiode 46 has the flat portion 43A under the photodiode 46 and the sidewall portion 43B outside the photodiode 46. Therefore, light obliquely incident can be reflected by the sidewall portion 43B of the reflective film 43 and directed toward the center part of the charge accumulation region 4 similarly to the case of the reflective film 51 shown in FIG. 22A.

Due to this feature, light that has passed through the charge accumulation region of the photodiode 46 (e.g. red light) can be focused on the center part of the charge accumulation region by the reflective film 43, and thus the sensitivity can be enhanced.

Furthermore, light obliquely incident on the surface of the silicon layer 45 can also be reflected and focused on the charge accumulation region, and therefore the entry of the light into an adjacent pixel and the occurrence of color mixing can be suppressed.

In addition, the charge accumulation region having large depth does not need to be formed in the silicon layer 45, and ion implantation with high energy does not need to be performed.

Accordingly, even if the miniaturization of the pixels progresses, the aspect ratio of the resist as the ion implantation mask is not increased and the break of the resist mask hardly occurs. This makes processing of the mask easier and can enhance the manufacturing yield.

Moreover, special apparatus for ion implantation with high energy does not need to be used and the number of steps can also be reduced.

Therefore, even if the miniaturization of the pixels progresses, a solid-state imaging device that has high sensitivity and achieves images having favorable image quality can be realized. Furthermore, this solid-state imaging device can be stably manufactured.

4. Modification Examples and Other Structures of Present Invention

It will also be possible to employ a dielectric multilayer film as the reflective film 43 in the structure of the embodiment shown in FIG. 13.

However, the reflective film 43 is so formed as to fill the trenches 23A as shown in FIG. 15 in this embodiment. Therefore, the progression of the miniaturization of the pixels makes it more difficult to form the reflective film 43 by using a dielectric multilayer film although a dielectric multilayer film can be employed when the pixel size is large.

By applying the manufacturing steps shown in FIGS. 14 to 20, a flat reflective film like that described in the above-mentioned Patent Document 1 (the reflective film 101 shown in FIG. 21) can also be easily formed.

Specifically, a solid-state imaging device is manufactured in the following manner.

First, without performing the formation of the trenches in the silicon layer 23 in the step shown in FIG. 14, the insulating film 44 and the reflective film 43 are sequentially deposited over the silicon layer 23 in the step shown in FIG. 15.

Subsequently, the reflective film 43 is divided by etching with use of the mask formed of the resist 61.

Furthermore, the insulating layer 42 is formed on the divided reflective film 43, and the insulating layer 42 is bonded to the silicon substrate 41.

Thereafter, the charge accumulation regions and the hole accumulation regions of the photodiodes are formed above the reflective films 43.

In this case, because the trenches are not formed in the silicon layer, it is also possible to use a silicon substrate directly as the silicon layer below the reflective film instead of using the SOI substrate in FIG. 14.

In each of the above-described embodiments, a reflective film is formed to obtain the reflective surface for reflecting light that reaches a deep part.

However, the embodiments of the present invention are not limited to a comparatively thin reflective film. A layer having somewhat large thickness may be formed and the reflective surface may be obtained by the surface of this layer. For example, a layer of an insulator such a silicon oxide or a silicon nitride may be so formed that its surface is a concave surface, and this concave surface may be used as the reflective surface.

The above-described embodiments are application to a CMOS solid-state imaging device. However, the embodiments of the present invention can be similarly applied also to solid-state imaging devices of other configurations, such as a CCD solid-state imaging device.

Also for the CCD solid-state imaging device, by providing a reflective film inside or under a charge accumulation region of a photodiode serving as a light-receiving part, red light can be reflected by the reflective film so that the sensitivity to red light can be enhanced.

In the above-described respective embodiments, a silicon layer is employed as the semiconductor layer in which photodiodes are formed. However, the embodiments of the present invention can be applied also to a solid-state imaging device obtained by forming photodiodes in another semiconductor layer (e.g. a Ge layer or a compound semiconductor layer).

The embodiments of the present invention can be applied also to a solid-state imaging device that receives and detects infrared light by the charge accumulation region of the photodiode. In this case, the material (reflective film or the like)

for forming the reflective surface is so selected that the reflective surface has sufficiently high reflectance to infrared light.

By applying the embodiments of the present invention, infrared light that has passed through the photodiode can be reflected by the reflective surface and returned to the center part of the photodiode, so that the sensitivity to infrared light can be enhanced.

The present invention is not limited to the above-described embodiments but can employ other various configurations without departing from the gist of the present invention.

The present application contains subject matter related to that disclosed in Japanese Priority Patent Application JP 2008-217255 filed in the Japan Patent Office on Aug. 26, 2008, the entire content of which is hereby incorporated by reference.

What is claimed is:

1. A method for manufacturing a solid-state imaging device, the method comprising the steps of:
    forming trenches in a silicon layer;
    forming a reflective film on the silicon layer in such a manner as to fill the trenches;
    etching the reflective film to divide the reflective film at part between the trenches;
    turning the silicon layer upside down and bonding the silicon layer onto a base that is separately prepared; and
    forming a charge accumulation region that serves as part of a photodiode in the silicon layer above the reflective film.

2. A method for manufacturing a solid-state imaging device, the method comprising the steps of:
    forming recesses in a silicon layer;
    forming a reflective film on a surface of the silicon layer;
    etching the reflective film to divide the reflective film above the recesses of the silicon layer and expose the silicon layer;
    epitaxially growing silicon from an exposed surface of the silicon layer to thereby form a silicon epitaxial layer covering the reflective film;
    turning the silicon layer upside down and bonding the silicon layer onto a base that is separately prepared; and
    forming a charge accumulation region that serves as part of a photodiode in the silicon layer above the reflective film.

3. A method for manufacturing a solid-state imaging device, the method comprising the steps of:
    forming, in a silicon layer, a hole that is substantially perpendicular to a surface of the silicon layer and has a concave surface as a bottom surface;
    forming a reflective film on the surface of the silicon layer and a surface of the concave surface by an anisotropic film deposition method;
    forming a second silicon layer on the silicon layer in such a manner as to fill the hole;
    removing the reflective film and the second silicon layer except for the reflective film and the second silicon layer in the hole;
    performing ion implantation of silicon for an upper part of the silicon layer and the second silicon layer in the hole to thereby form an amorphous silicon layer;
    crystallizing the amorphous silicon layer; and
    forming a charge accumulation region that serves as part of a photodiode above the reflective film.

* * * * *